(12) United States Patent
Farnworth et al.

(10) Patent No.: US 7,329,899 B2
(45) Date of Patent: Feb. 12, 2008

(54) WAFER-LEVEL REDISTRIBUTION CIRCUIT

(75) Inventors: Warren M. Farnworth, Nampa, ID (US); Steven M. McDonald, Star, ID (US)

(73) Assignee: Micron Technology, Inc., Boise, ID (US)

( * ) Notice: Subject to any disclaimer, the term of this patent is extended or adjusted under 35 U.S.C. 154(b) by 161 days.

(21) Appl. No.: 11/048,227

(22) Filed: Feb. 1, 2005

(65) Prior Publication Data

US 2005/0146013 A1 Jul. 7, 2005

Related U.S. Application Data

(60) Continuation of application No. 10/669,949, filed on Sep. 24, 2003, now Pat. No. 6,884,642, which is a division of application No. 10/347,027, filed on Jan. 17, 2003, now Pat. No. 6,744,067.

(51) Int. Cl.
*H01L 23/58* (2006.01)
*H01L 29/10* (2006.01)

(52) U.S. Cl. .................. 257/48; 257/737; 257/773

(58) Field of Classification Search .................. 257/48, 257/773, 737, 738, 778, 734, 780
See application file for complete search history.

(56) References Cited

U.S. PATENT DOCUMENTS 5,391,892 A 2/1995 Devereaux et al.
5,440,241 A 8/1995 King et al.
5,894,161 A 4/1999 Akram et al.
6,097,087 A 8/2000 Farnworth et al.
6,233,185 B1 5/2001 Beffa et al.
6,294,837 B1 9/2001 Akram et al.
6,313,658 B1 11/2001 Farnworth et al.
6,380,555 B1 4/2002 Hembree et al.
6,452,415 B1 9/2002 Farnworth et al.
2001/0015439 A1 8/2001 Hembree et al.
2003/0227079 A1* 12/2003 Chia et al. .................. 257/723

* cited by examiner

*Primary Examiner*—Monica Lewis
(74) *Attorney, Agent, or Firm*—TraskBritt (57) ABSTRACT

A semiconductor component configured for wafer-level testing includes a semiconductor die having at least one die contact electrically exposed for coupling with a redistribution circuit that electrically couples at least one die contact to an extended contact such as a bumped contact. A wafer-level redistribution circuit interconnects a plurality of dice and includes a redistribution circuit for coupling between a die contact on one of the dice and a corresponding bumped contact. The wafer-level redistribution circuit further includes a bus conductor traversing each of the plurality of dice for electrically coupling with at least another one of the plurality of dice. At least one other conductor couples the redistribution circuit to the bus conductor.

10 Claims, 7 Drawing Sheets

WAFER-LEVEL REDISTRIBUTION CIRCUIT

CROSS-REFERENCE TO RELATED APPLICATIONS

This application is a continuation of application Ser. No. 10/669,949, filed Sep. 24, 2003, now U.S. Pat. No. 6,884,642, issued Apr. 26, 2005, which is a divisional of application Ser. No. 10/347,027, filed Jan. 17, 2003, now U.S. Pat. No. 6,744,067, issued Jun. 1, 2004.

BACKGROUND OF THE INVENTION

1. Field of the Invention

The present invention relates generally to semiconductor testing and, more particularly, to wafer-level burn-in and testing of components on semiconductor wafers.

2. State of the Art

It is advantageous in semiconductor processing to detect and screen out defective integrated circuits (ICs) as early as possible in the manufacturing process. It is appreciated that many manufactured ICs fail within the first few months or weeks of use due to processing defects. Such a defect profile is commonly known as "infant mortality" and is clearly very undesirable and unacceptable for a typical IC customer. To discover those circuits that are susceptible to infant mortality, manufacturing processes have included high temperature testing of ICs for extended periods of time before shipping products to a customer.

In a typical semiconductor manufacturing process, a multiplicity of integrated circuits is formed as individual dice on a semiconductor wafer. Such a multiplicity of integrated circuits may number in the tens to hundreds, or even thousands (such as in a 300 mm wafer) of individual dice which are generally repeated across the wafer in a two-dimensional array. Once the dice are formed on a semiconductor wafer, the dice are then tested to determine which dice are functional with such a determination performed, generally, by probing each die individually. The probing of individual dice is performed using very costly probe equipment while the die is still in wafer form. Presently available probe equipment contacts each bonding pad on an individual die with a separate probe. A typical probe test requires that each die be probed in order to determine the correct and acceptable functionality of each die. However, due to the expensive nature of the probing test equipment, reliability testing (i.e., testing an individual circuit over time) is generally not performed.

It should be apparent that the purpose of wafer-level probing is to determine as early as possible in the manufacturing process the functional nature of each individual die. The earlier a defective die is detected, the fewer subsequent processing steps are performed on the defective die, which results in a reduction of costs associated with individual wafer processing. Upon the completion of functional probe testing, those defective dice are noted and subsequent manufacturing processes are not exerted.

Upon the identification of functional and nonfunctional dice, the dice are then separated or singulated by way of a dicing process. Following singulation, functional dice are packaged into integrated circuit packages or undergo further processing which allows the dice to be assembled as part of a higher-level assembly, which itself may be packaged. Once the dice have been packaged or prepared for packaging within a higher assembly, thorough electrical testing is performed to determine whether each packaged integrated circuit properly performs the functionality for which it was designed. Upon successful package testing, integrated circuits may be sold or integrated into higher assemblies.

An additional common manufacturing process includes subjecting the packaged integrated circuits to a form of reliability testing called burn-in. Burn-in testing involves testing an IC for an extended period of time at elevated operational temperatures. During the burn-in test, additional infant mortality failures manifest themselves and are further culled from the original multiplicity of manufactured dice. Burn-in testing may also utilize reduced temperature testing and may further include repetitive cycling of the packaged integrated circuit in an attempt to fatigue and fail frail ICs. Typical burn-in testing has utilized a concept of burning in packaged dice which have less fine-pitched inputs and outputs. Furthermore, the inputs and outputs of the packaged integrated circuit provide a more economical testing approach rather than the very fine-pitched probing mechanism used for individual die probing.

Conventional economical and high-volume approaches for burn-in testing of dice at a wafer level have required expensive and customized probing equipment. Therefore, there exists a need for a wafer-level testing methodology that does not require special processing or elaborate probe testing of individual integrated circuits at a wafer-level burn-in stage.

BRIEF SUMMARY OF THE INVENTION

In accordance with the present invention, semiconductor components configured for wafer-level testing, semiconductor wafers fabricated for wafer-level testing and methods for fabricating wafer-level testable dice are provided.

In one embodiment of the present invention, a wafer-level redistribution circuit for interconnection with a plurality of dice is provided. The wafer-level redistribution circuit includes a redistribution circuit for coupling between at least one die contact on one of the plurality of dice and a corresponding bumped contact. The wafer-level redistribution circuit further includes a bus conductor traversing each of the plurality of dice for electrically coupling with at least another one of the plurality of dice and at least one other conductor for coupling the redistribution circuit to the bus conductor.

A semiconductor component includes a semiconductor die that performs specific functions and contains circuitry for performing those specific functions. The semiconductor die is fabricated according to conventional fabrication processes with each die including a defined number of die contacts that are electrically exposed for subsequent interconnection with other electronic components. One embodiment of the present invention contemplates busing contacts of interest together from at least one die to at least one other die for wafer-level testing.

In addition to at least one die, the semiconductor component includes a redistribution circuit for electrically coupling the die contact on the semiconductor die to a redistributed contact such as a bumped contact. The redistribution circuit is formed on top of the conventionally processed semiconductor wafer with the conductive trace electrically coupling with the die contact. The conductive trace is preferably formed by patterning a conductor such as aluminum onto the exposed wafer surface. The redistribution circuit may or may not physically contain the solder ball portion of the bumped contact; however, in one topology, the redistribution circuit's patterned conductor may serve as an isolation region for forming an open circuit therein when a die is determined to be nonfunctional.

The semiconductor component configured for wafer-level testing also includes a bus conductor for providing a die-to-die routing of a specific signal. The specific signal is then available to test equipment at the wafer level for providing inputs or for receiving outputs. The bus conductor traverses at least a portion of the semiconductor die for providing the die-to-die interconnection or busing function. The bus conductor may also be formed from patterned conductors and is preferably formed in the same processes that form the patterned conductor used in the redistribution layer.

The bus conductor is also in electrical communication with the redistribution circuit to receive or provide a signal to the die contact of the specific die. To facilitate the electrical connection between the bus conductor and the redistribution circuit, various embodiments are presented. One embodiment contemplates the intersection of the bus conductor and the redistribution circuit, while another embodiment forms an additional conductor for providing the electrical coupling. As with the bus conductor, this conductor may be formed in a unitary process with both the redistribution circuit and the bus conductor.

While not all dice on a wafer may be functional and cooperative for wafer-level testing, the present invention contemplates probe testing the dice on a wafer that have been manufactured with the wafer-level testable circuitry of the present invention. Functional and nonfunctional dice are identified with location information stored that is used in a follow-up process that isolates the nonfunctional dice from the networked configuration of the dice on the wafer. In order to remove or isolate the nonfunctional dice from the wafer-level test grid, one or more die contacts from the nonfunctional wafer are isolated from the respective bus conductor. The isolation process may take the form of removing any outer passivation layer that exists over the redistribution circuit region or the conductor that connects the redistribution circuit to the bus conductor to expose the underlying conductive trace. Removal of any outer passivation layer may be performed by laser ablation or by an etching process or otherwise. Additionally, the conductive trace is interrupted to form an electrical open circuit between the die contact and the bus conductor. The conductive trace may also be laser ablated or etched or otherwise removed according to known processing methods.

Following the busing together of a plurality of dice on a wafer followed by the isolation of nonfunctional dice from the array of functional dice, the wafer is in a wafer-level testable configuration. Wafer testing may be performed which may include burn-in testing without requiring intricate and otherwise expensive test equipment. Various methods for manufacturing wafer-level testable semiconductor devices as well as methods for retrofitting existing wafer designs for wafer-level testing are also encompassed by the present invention.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Semiconductor components, such as bare semiconductor dice, semiconductor packages, chip scale packages, BGA devices, and semiconductor wafers, may include terminal contacts in the form of bumps. This type of component is sometimes referred to as a "bumped" component (e.g., bumped die, bumped package, bumped wafer).

Figure 1:
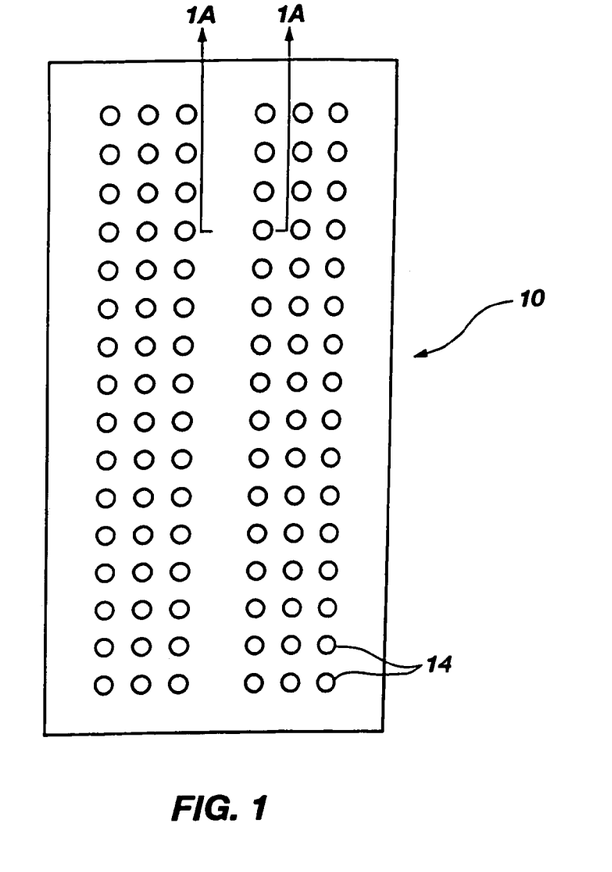
FIG. 1 is a bottom view of a semiconductor package having external bumped contacts in accordance with an embodiment of the present invention.
Figure 1A:
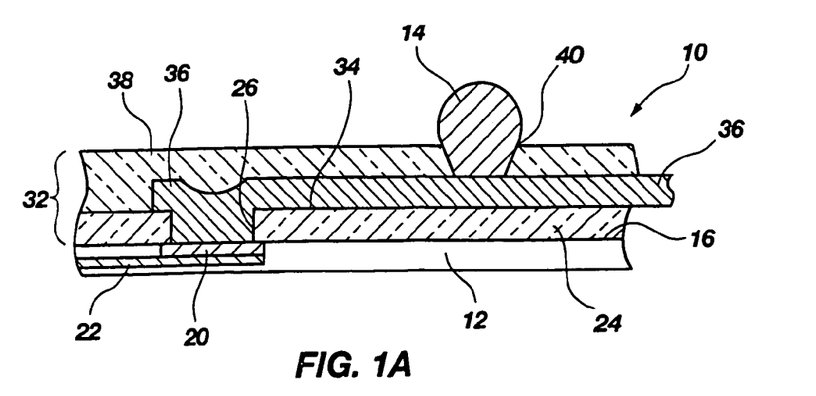
FIG. 1A is an enlarged cross-sectional view taken along the section line 1A-1A of FIG. 1 illustrating a redistribution circuit as well as a wafer-level test interconnect, in accordance with an embodiment of the present invention.

FIGS. 1 and 1A illustrate a bumped semiconductor component which comprises, for example, a "flip chip" configured semiconductor package 10. The package 10 includes a semiconductor die 12 and an array of bumped contacts 14 bonded to a face 16 (circuit side) of the die 12. The bumped contacts 14 allow the package 10 to be surface mounted to a substrate having a corresponding pattern of terminal pads thereon, such as a printed circuit board (PCB). Typically, the bumped contacts 14 are made of solder, such that the package 10 can be bonded to the substrate using a solder reflow process. However, conductive bumps of conductive or conductor-filled epoxy are also conventionally employed. In addition, the bumped contacts 14 can be arranged in a dense array, such as a ball grid array (BGA) or a fine ball grid array (FBGA), to provide a high input/output capability for the package 10. Further, the bumped contacts 14 may have a spherical, hemispherical, conical, dome, pillar, column, stud or other shape.

The die 12 contained in the package 10 includes a pattern of die contacts 20 (e.g., bond pads) in electrical communication with the bumped contacts 14. In addition, the die 12 includes internal conductors 22 in electrical communication with the die contacts 20 and with various integrated circuits formed on the die 12. The die 12 also includes a passivation layer 24 formed on the face 16 of the die 12 and openings 26 through the passivation layer 24 to the die contacts 20. Typically, the passivation layer 24 comprises a glass, such as boro-silicate glass (BSG), phosphosilicate glass (PSG), borophosphosilicate glass (BPSG), an oxide, such as $SiO_2$, or a polymer, such as polyimide or silicon nitride (SiN).

The die 12 also includes a wafer-level test redistribution circuit 32 formed on a surface 34 of the passivation layer 24, which interconnects the bumped contacts 14 to the die contacts 20 and further interconnects at least a portion of die contacts 20 with like contacts on an adjacent like die for providing a busing or ganging of input/output terminals of the like die during wafer-level testing. The wafer-level test redistribution circuit 32 includes a pattern of conductors 36 in electrical communication with the die contacts 20 and an outer passivation layer 38 which covers the conductors 36. The conductors 36 can have a "fan out" configuration to provide a required pitch and pattern for the bumped contacts 14 as well as die-to-die coupling of like contacts for wafer-level testing. Redistribution circuit 32 may be manufactured using deposition, masking and etching steps for exposing die contacts 20 and depositing patterned conductors 36 in a desired interconnection array.

The outer passivation layer 38 of the wafer-level test redistribution circuit 32 insulates the conductors 36 and helps to locate and confine the bumped contacts 14. Thus, the outer passivation layer 38 functions as a solder mask to prevent solder from flowing between the bumped contacts 14 during attachment of the bumped contacts 14 and during surface mounting of the package 10. The outer passivation layer 38 may comprise a dielectric material. Suitable materials for the outer passivation layer 38 include polymers, such as polyimide SiN, glasses, such as BSG, PSG, BPSG, or oxides, such as $SiO_2$. The outer passivation layer 38 includes openings 40, and the bumped contacts 14 are located within the openings 40 and bonded to the conductors 36.

Figure 2:
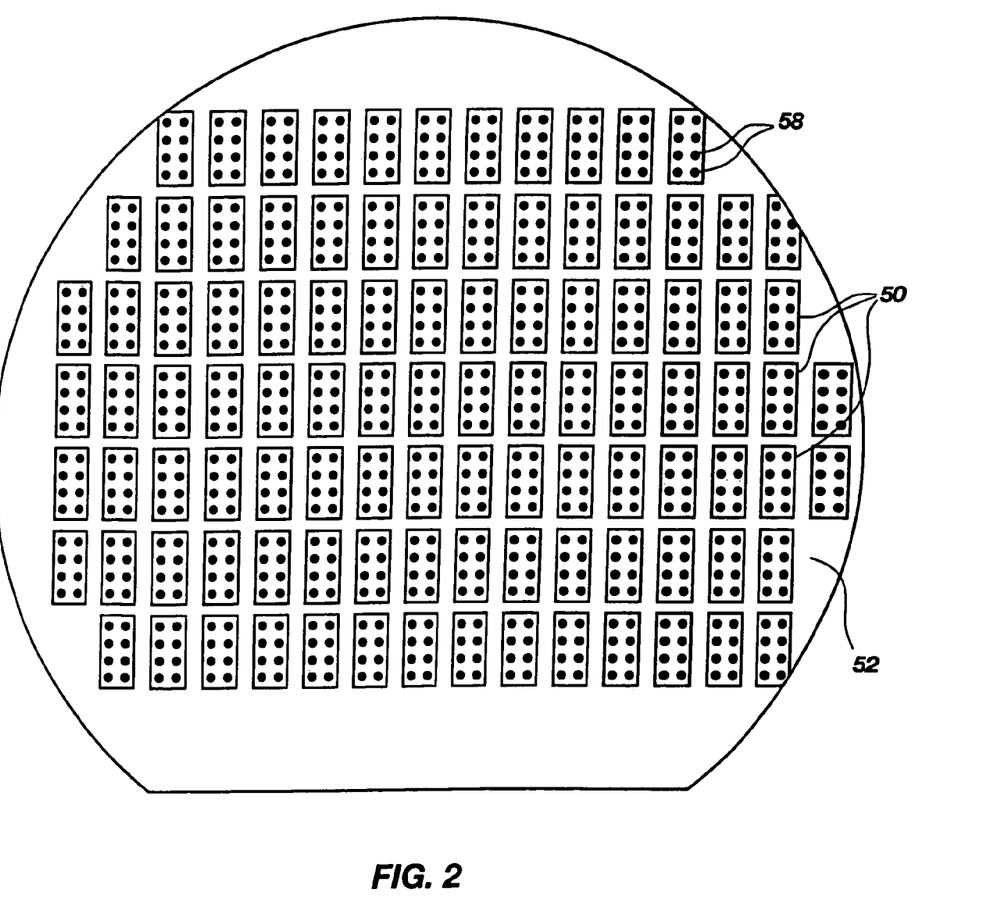
FIG. 2 is a plan schematic view of a wafer of semiconductor components including wafer-level test interconnects, in accordance with an embodiment of the present invention.

FIG. 2 schematically illustrates a processed wafer configured for wafer-level testing, in accordance with an embodiment of the present invention. A wafer 52 is illustrated as generally being comprised of a plurality of components 50, each of which is in the form of a processed die having electronic circuitry formed in accordance with the desired specific semiconductor device function and further processed with the wafer-level test redistribution circuit as described previously in FIG. 1. A portion of the wafer-level test redistribution circuit is illustrated in FIG. 2 according to the exposed portions, namely, bumped contacts 58, which may be individually utilized for probe testing of individual dice. Furthermore, the various components 50 of wafer 52 may be electrically coupled to adjacent dice through an external means, in accordance with an alternate embodiment, as described below in relationship to FIG. 7, or through a preferable interconnection mechanism which provides adjacent interconnection through the use of patterned conductors on wafer 52.

Figure 3:
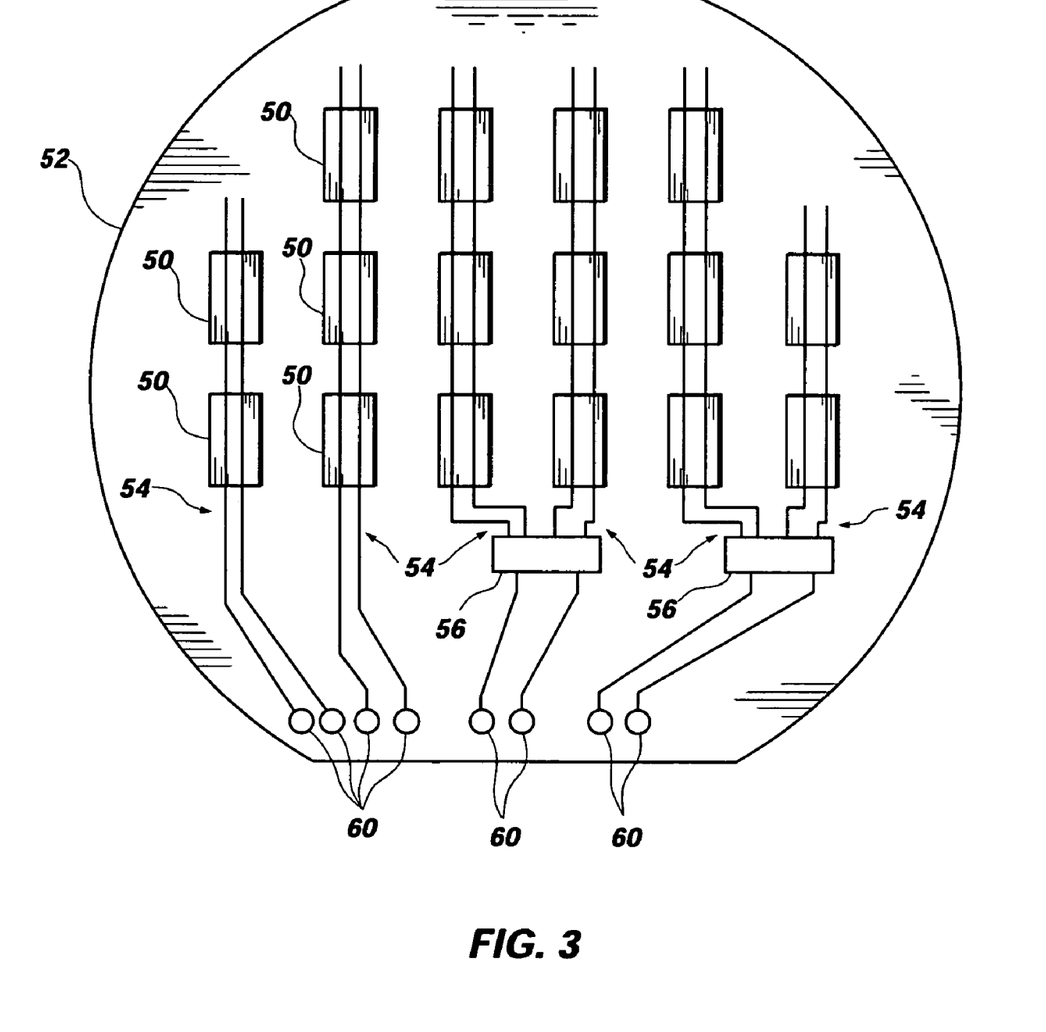
FIG. 3 is also a plan view of a semiconductor wafer illustrating wafer-level test interconnects between adjacent dice thereon, in accordance with an embodiment of the present invention.

FIG. 3 schematically illustrates wafer 52 fabricated in accordance with the preferred patterned interconnection of adjacent dice through the use of patterned conductors which form a portion of the wafer-level test redistribution circuit as described previously with relation to FIG. 1. FIG. 3 illustrates components 50 being coupled to adjacent others of components 50 through the use of patterned conductors 54. To simplify the view of FIG. 3, the bumped contacts 58 of FIG. 2 have not been illustrated in FIG. 3 but are further detailed with reference to FIG. 4. Referring to FIG. 3, patterned conductors 54 gang or otherwise connect in a bus or parallel format a plurality of components 50 for facilitating the conduction of input/output signals to each of components 50 during wafer-level testing. Patterned conductors 54 may be further combined or, alternatively, multiplexed through bus circuits 56, which may be formed as separate integrated circuit components, or patterned conductors 54 may alternatively be directly routed to wafer terminals 60.

In the case of "legacy" or existing wafer layouts, it is preferable that patterned conductors 54 be directly coupled to wafer terminal 60 so as to not require any processing modifications to the electronic componentry or layout of wafer 52. As described herein and with respect to existing wafer layouts, the application of a wafer-level test redistribution circuit may be a post-component circuitry fabrication process which attaches patterned conductors to existing die contacts for redistribution of the physical and electrical interfaces with the circuit of die 12 (FIG. 1) for facilitating wafer-level testing.

Figure 4:
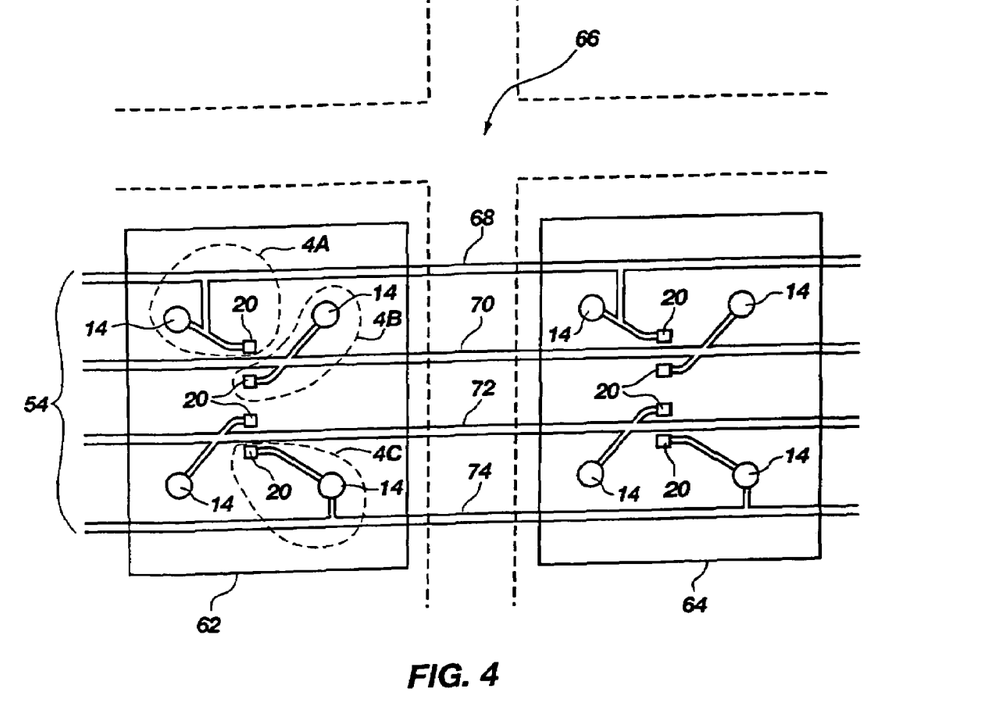
FIG. 4 illustrates various patterned conductors and FIGS. 4A-4C are detailed views of a wafer-level test interconnect for coupling adjacent dice, in accordance with an embodiment of the present invention.

FIG. 4 is a detailed top view of a wafer-level test redistribution circuit, in accordance with an embodiment of the present invention. FIG. 4 illustrates adjacent components 62 and 64 as interconnected for testing at a wafer-scale level. Components 62 and 64 are separated by street or scribe lane 66 for use in a post wafer-level test segmentation process wherein components 62 and 64 are segmented from a unitary wafer into physically separated components. While FIG. 4 depicts adjacent components being coupled in a horizontal manner (with respect to the orientation of FIG. 4), vertical busing for interconnection of adjacent components and even a combination of vertical and horizontal as well as diagonal interconnections in the plane of the wafer is also contemplated. Furthermore, while FIG. 4 illustrates the busing of all contacts 14, 20 resident on components 62 and 64 a partial busing is also contemplated wherein only a portion of the contacts 14, 20, and even as few interconnections as for the busing of power and ground signals, is also contemplated by the present invention.

FIG. 4 illustrates the coupling of components 62 and 64 through the use of patterned conductors 54, or more specifically bus conductors 68 through 74. FIG. 4 further illustrates a redistribution circuit between die contacts 20 and bumped contacts 14 and, more specifically, FIGS. 4A-4C (specifically) respectively depict various interconnection schemes 4A-4C contemplated for coupling the bus conductors to the redistribution circuits.

Figures 4A, 4B:
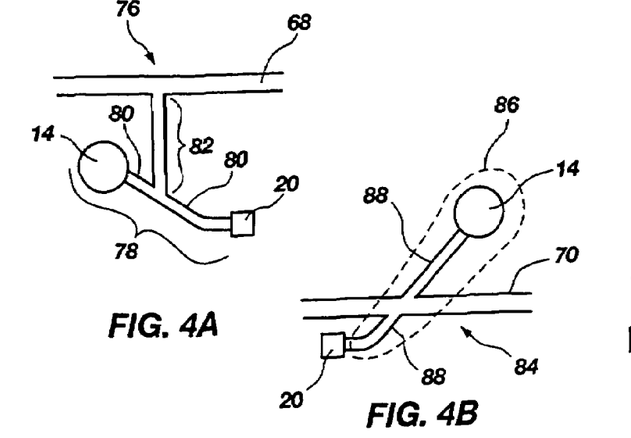

FIG. 4A depicts one embodiment of a wafer-level test redistribution circuit 76 which includes a redistribution circuit 78 for facilitating the coupling of die contact 20 with an external circuit board or assembly via bumped contact 14. Redistribution circuit 78 includes a patterned conductor 80 for facilitating electrical contact between bumped contact 14 and die contact 20. Manufacturing processes of such a redistribution circuit are described above with reference to FIG. 1A. Wafer-level test redistribution circuit 76 further comprises the coupling of redistribution circuit 78 with bus conductor 68 through the use of a patterned conductor 82 which provides the electrical coupling of specific inputs and outputs of specific components to bus conductors 68 for coupling with other corresponding inputs and outputs of other components on the same wafer, as well as coupling with bus circuits 56 or wafer terminals 60 (FIG. 3).

FIG. 4B illustrates another embodiment of a wafer-level test redistribution circuit 84 which includes a redistribution circuit 86 used for coupling die contact 20 with an external interface such as a board or other higher-level assembly. Redistribution circuit 86 includes patterned conductor 88 which electrically couples die contact 20 with bumped contact 14, and is further electrically coupled to bus conductor 70 by the intersection of bus conductor 70 with patterned conductor 88.

Figure 4C:
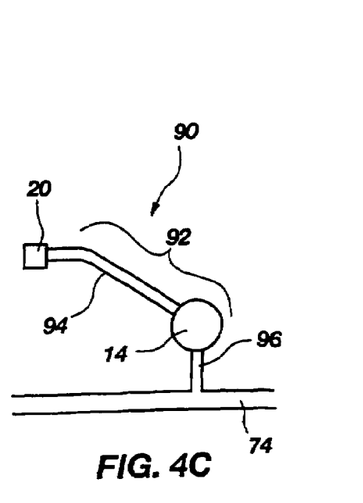

FIG. 4C depicts yet another embodiment of wafer-level test redistribution circuit 90 which includes a redistribution circuit 92 for coupling die contact 20 with an external interface such as a board or other higher-level assembly. Redistribution circuit 92 includes a patterned conductor 94 and a bumped contact 14. Patterned conductor 94 is coupled to bus conductor 74 by way of a patterned conductor 96 which is in electrical communication with patterned conductor 94. While various exemplary interconnection embodiments have been depicted, other forms of coupling a die contact 20 with a bus conductor are also contemplated to be within the scope of the present invention.

Figure 5:
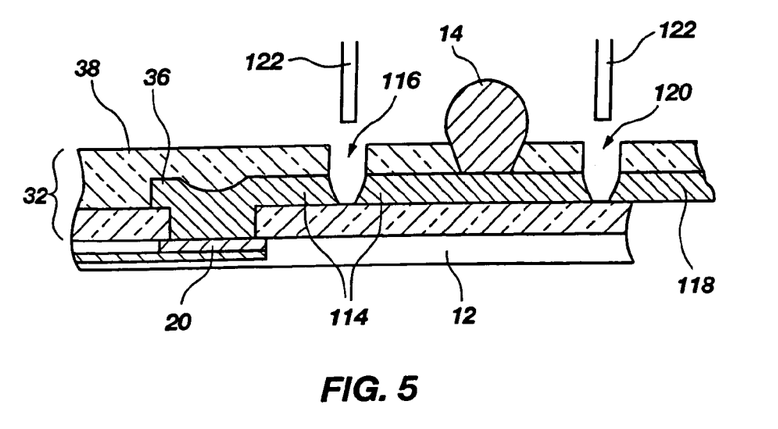
FIG. 5 is a cross-sectional view of an isolated contact of a defective die from the wafer-level test interconnect, in accordance with the present invention.

FIG. 5 is a cross-sectional view of isolating die contacts of failed dice, in accordance with an embodiment of the present invention. It should be recalled that the formation of wafer-level test redistribution circuit 32 may occur as a post process to the fabrication of the plurality of dice 12 on the wafer. At such a processing point, probe testing has been performed and, therefore, the application of the wafer-level test redistribution circuit 32 results in the interconnection of all dice and inputs and outputs as designated in the patterning design for the formation of the patterned conductors. However, it is known that some dice will generally be nonoperational and defective with the specific defection mechanism generally uncharacterized and unpredictable. Therefore, following the fabrication of wafer-level test redistribution circuit 32, the wafer, and more precisely the individual die, is subjected to probe testing to identify and discriminate between functional and nonfunctional dice. Because of the various failure mechanisms in the nonfunctional dice, those dice must be isolated from the bus conductors so as to not negatively affect the ability to perform wafer-level testing or damage test equipment by the introduction of, for example, short-circuits, excessive capacitance, or other electrically undesirable conditions.

Once the nonfunctional dice have been identified, the patterned conductors connecting die contact 20 with the bus conductors must be severed or otherwise interrupted. FIG. 5 illustrates a severing process wherein outer passivation layer 38 is removed to provide access to the patterned conductor. It is appreciated that mechanisms for removing outer passivation layer 38 may include photolithographic processes as well as an illustrated process wherein a laser, such as laser 122, ablates outer passivation layer 38, to expose patterned conductor 36 for severing in a subsequent process. One such severing process contemplated within the scope of the present invention further utilizes laser 122 to further ablate patterned conductor 36, to form an open circuit between die contact 20 and bus conductors. Yet another approach for forming an open circuit in the patterned conductor includes ablating outer passivation layer 38 using laser 122 and performing an etching process for removing the underlying patterned conductor to isolate the nonfunctional component from any subsequent wafer-level testing. In this currently preferred approach, no photolithography is required as the passivation layer 38 acts as a mask for the etching process.

FIG. 5 illustrates the severing of patterned conductor 114 by the forming of an opening 116 through one of the aforementioned approaches. Alternatively, when the redistribution circuit 32 is coupled to a bus conductor through the formation of a patterned conductor coupling from the bumped contact region toward the bus conductor, conductor 118 may be severed by forming a void 120 through one of the aforementioned processes, to form an open circuit in yet another manner between die contact 20 and the respective bus conductor.

Figure 5A:
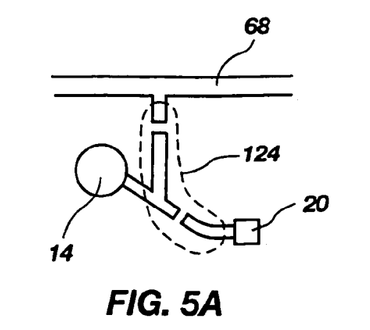
FIGS. 5A-5C are detailed views of isolation regions of a wafer-level test interconnect, in accordance with an embodiment of the present invention.
Figure 5B:
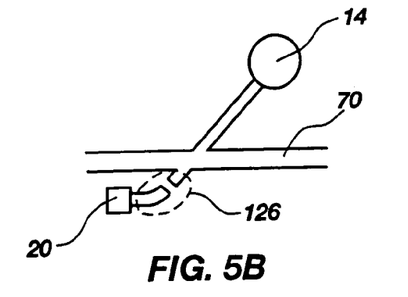
Figure 5C:
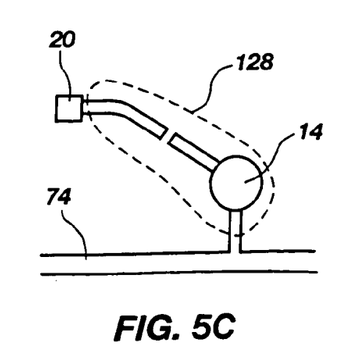

FIGS. 5A-5C correspond to the wafer-level test redistribution circuit embodiments of FIGS. 4A-4C and further illustrate acceptable locations for severing or forming an open circuit with which to isolate the die contact from the bus conductor. In FIG. 5A, formation of an open circuit may appropriately occur in region 124. Furthermore, in FIG. 5B, isolation may occur through the formation of an open circuit in region 126. Similarly, an open circuit in a wafer-level test redistribution circuit embodiment as depicted in FIG. 5 may occur by forming a severing of the patterned conductor in region 128. It should be appreciated by those of ordinary skill in the art that a subset of wafer-level test redistribution circuits on a particular die may be severed and form an effective isolation of the die from the wafer-level test process. For example, an acceptable isolation of a nonfunctional die may be made in certain applications by the severing of the power and/or ground interconnection with the corresponding die contact with any resulting capacitance on the remaining connected inputs and outputs being tolerated as acceptable capacitances.

Figure 6:
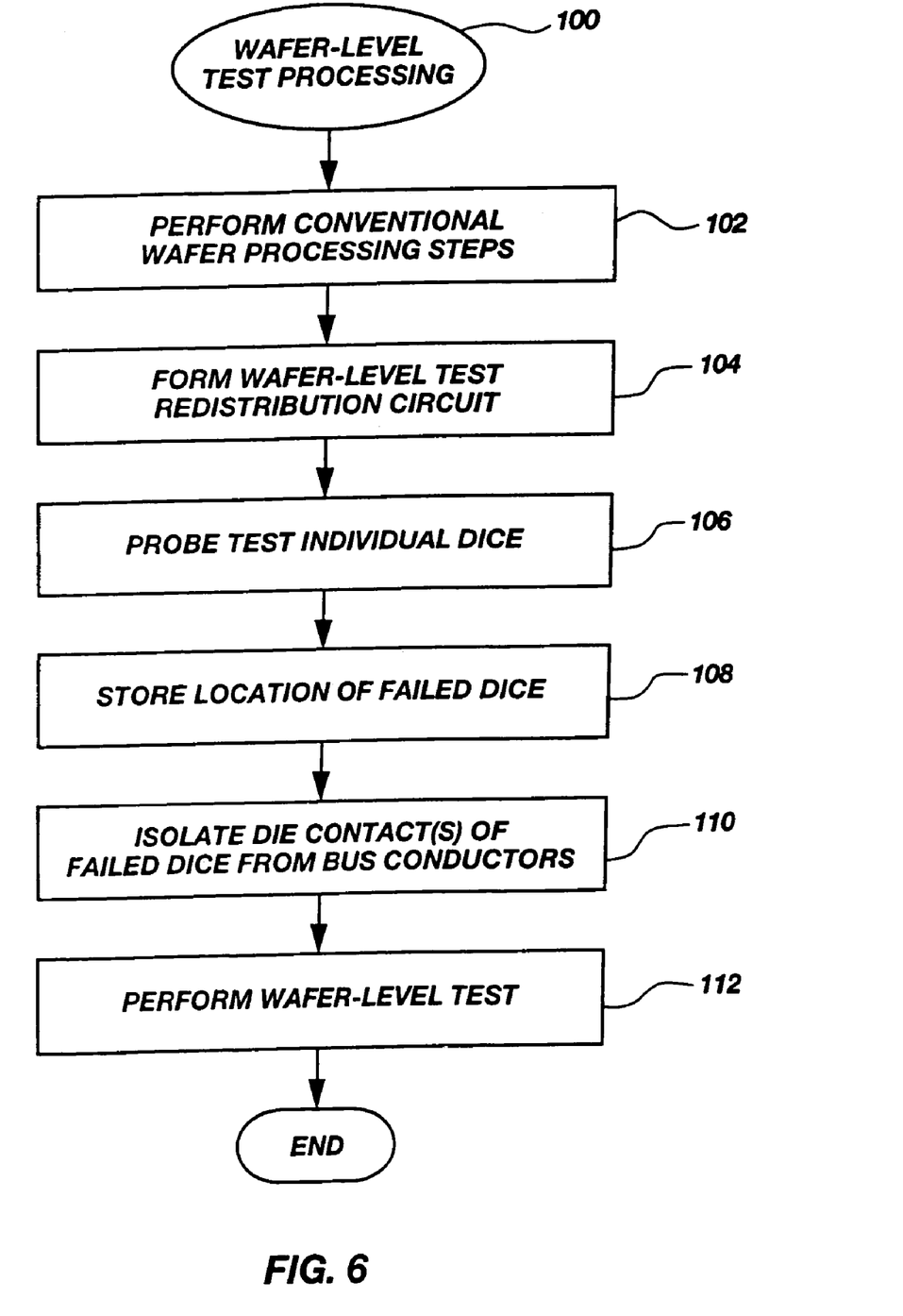
FIG. 6 is a flow chart of wafer-level test processing in accordance with an embodiment of the present invention.

FIG. 6 is a flow chart detailing the steps for performing wafer-level test processing, in accordance with an embodiment of the present invention. Wafer-level test processing 100 is performed by preparing or processing a wafer having discrete components or dice thereon according to conventional processing steps 102. Such steps for performing conventional processing are appreciated by those of ordinary skill in the art and, in accordance with the present invention, include the process of making die contacts 20 electrically available for the electrical coupling of wafer-level test redistribution circuit 32. Subsequent to the formation of a wafer using conventional processing techniques, a plurality of wafer-level test distribution circuits are formed over the wafer, including the formation of redistribution circuits 78, 86, and 92 for electrically routing the die contacts out to an interface such as bumped contacts 14. Furthermore, step 104 further includes the formation of patterned conductors such as patterned conductors 82 and 96 of FIGS. 4A and 4C respectively for electrically coupling die contacts 20 with corresponding bus conductors, or, alternatively, as illustrated in FIG. 4B, bus conductor 70 may intersect redistribution circuit 86 to provide electrical continuity therewith. The present invention contemplates a unitary process for forming (i) the redistribution circuits for coupling die contact 20 with bump contacts 14, (ii) the formation of bus conductors 68-74, and (iii) the formation of patterned conductors 82 and 96 for coupling with the bus conductors.

In step 106, the individual dice of the processed wafer then undergo probe testing of each individual die or groups of dice in order to determine and segregate operational dice from non-functional dice. In step 108, the identities of the functional and nonfunctional dice on the wafer-under-test are identified and retained for future processing. Step 110 isolates one or more die contacts from bus conductors (see FIG. 5) according to the test results from probe testing in step 106. The nonfunctional dice are isolated prior to performing wafer-level testing in step 112. Wafer-level testing and the coupling of equipment therewith is well known to those of ordinary skill in the art.

Figure 7:
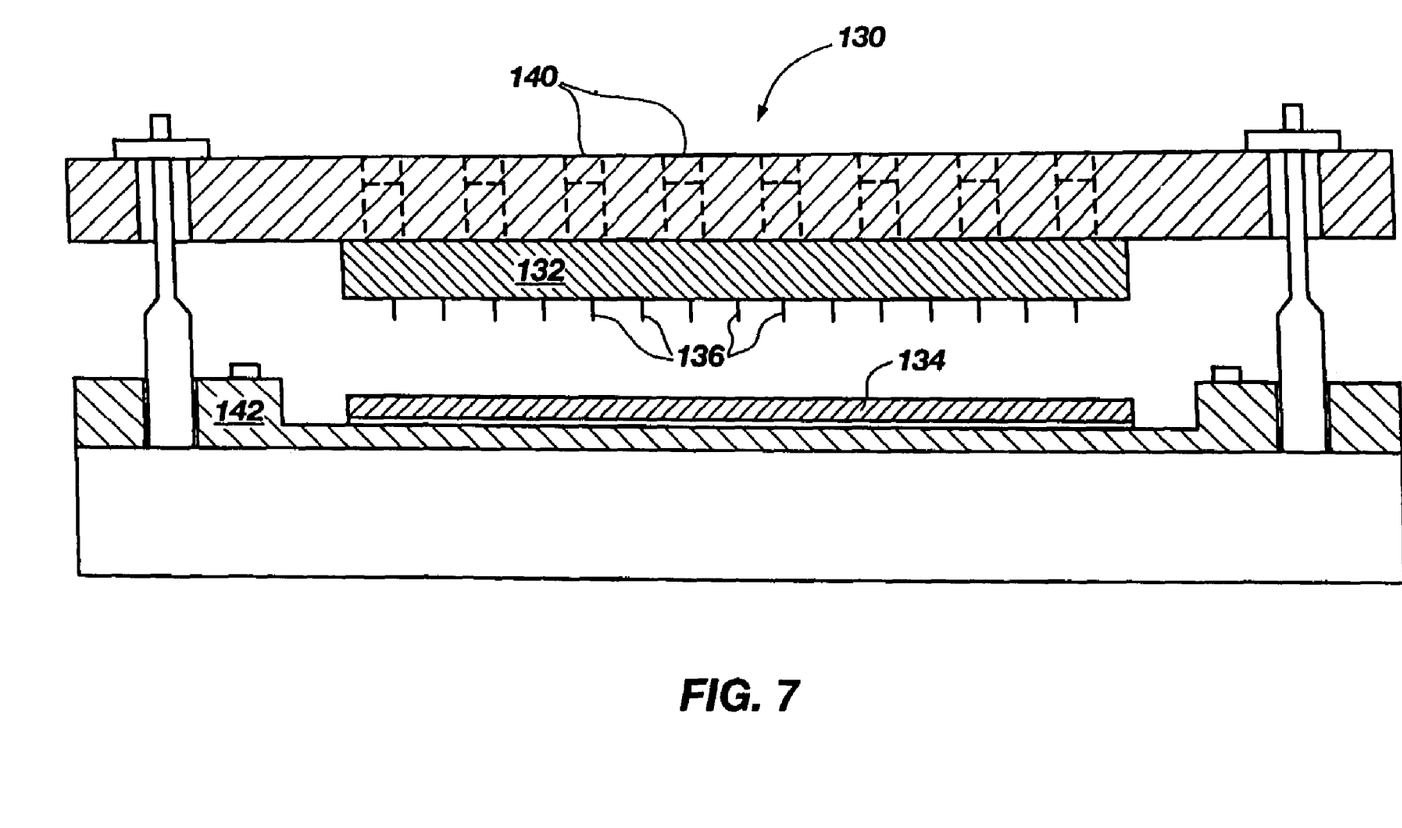
FIG. 7 illustrates an alternative coupling of adjacent dice for performing wafer-level testing, in accordance with another embodiment of the present invention.

FIG. 7 illustrates an alternate embodiment for coupling the individual components together for wafer-level testing through the use of busing external to the wafer. In the present embodiment, the entire wafer is loaded into a fixture 130, the cross-section of which is seen in FIG. 7. In general, the fixture serves to bring a printed circuit board (PCB) 132 into precise electrical contact with the bumped contacts on the wafer 134. Direct contact is made from PCB 132 to wafer 134 through a plurality of conductive probe pins 136, one probe pin 136 per bumped contact 14 to be bused for wafer-level testing. Therefore, each component on wafer 134 is independently routed via the probe pins 136 and traces of the PCB 132 to connectors 140 which electronically connect the PCB 132 and, hence, the wafer 134 to the outside world. Outboard test equipment as is known in the art can be connected to operate the PCB 132 and wafer during test and burn-in. This allows each component to be tested and allows all the dice on the entire wafer 134 to be tested in parallel.

Because the connection of probe pins with other probe pins is performed external to the wafer, the configuration of probe pins 136 remains constant for the particular wafer layout regardless of which dice are nonfunctional. The nonfunctional dice are open-circuited from the remaining bused dice by the isolation process as described with respect to FIG. 5. Further, since bus coupling occurs at the bumped contact, the isolation region may be located anywhere along the redistribution circuit which would result in an open circuit between the bumped contact and the die contact.

The wafer 134 is attached to a carrier frame 142 which may then be mated with PCB 132. Probe pins 136 are then aligned and brought into contact and a uniform compressing force is exerted across both the PCB 132 and the wafer 134, thereby maintaining proper contact between them.

While certain exemplary embodiments of the invention have been described, modifications thereto may be made and other embodiments may be devised without departing from the spirit of the invention and the scope of the appended claims.

What is claimed is:

1. A wafer-level redistribution circuit for interconnection with a plurality of dice, including:
    a redistribution circuit including a patterned conductor for coupling between at least one die contact on one of the plurality of dice and a corresponding bumped contact;
    a bus conductor traversing each of the plurality of dice for electrically coupling with at least another one of the plurality of dice; and
    at least one other conductor for directly coupling the patterned conductor of the redistribution circuit to the bus conductor.

2. The wafer-level redistribution circuit of claim 1, further comprising an outer passivation layer over the redistribution circuit and the at least one other conductor.

3. The wafer-level redistribution circuit of claim 2, the outer passivation layer is selectively removable to expose at least a portion of the redistribution circuit and at least one other conductor for forming an electrical open circuit between at least one die contact and the at least one other conductor when at least one of the plurality of dice is determined to be defective.

4. The wafer-level redistribution circuit of claim 1, the at least one other conductor directly electrically couples with the patterned conductor of the redistribution circuit.

5. The wafer-level redistribution circuit of claim 4, the at least one other conductor configured to have removed a portion of the at least one other conductor to form an open circuit between the at least one die contact and the bus conductor on nonfunctional ones of the plurality of dice.

6. The wafer-level redistribution circuit of claim 4, the redistribution circuit configured to have removed a portion of the patterned conductor of the redistribution circuit to form an open circuit between the at least one die contact and the bus conductor on nonfunctional ones of the plurality of dice.

7. The wafer-level redistribution circuit of claim 1, the at least one other conductor and the bus conductor are integral and directly electrically couple with the patterned conductor of the redistribution circuit.

8. The wafer-level redistribution circuit of claim 7, the redistribution circuit configured to have removed a portion of the patterned conductor of the redistribution circuit to form an open circuit between the at least one die contact and the bus conductor on nonfunctional ones of the plurality of dice.

9. A wafer-level redistribution circuit for interconnection with a plurality of dice, including:
    a redistribution circuit including a patterned conductor for coupling between at least one die contact on one of the plurality of dice and a corresponding bumped contact;
    a bus conductor traversing each of the plurality of dice for electrically coupling with at least another one of the plurality of dice; and
    at least one other conductor directly electrically coupling with the bumped contact.

10. The wafer-level redistribution circuit of claim 9, the redistribution circuit configured to have removed a portion of the patterned conductor of the redistribution circuit to form an open circuit between the at least one die contact and the bus conductor on nonfunctional ones of the plurality of dice.

* * * * *